(12) United States Patent
Miyanaga et al.

(10) Patent No.: US 10,687,429 B2
(45) Date of Patent: Jun. 16, 2020

(54) SWITCH AND DISPLAY DEVICE

(71) Applicant: EIZO Corporation, Ishikawa (JP)

(72) Inventors: Shuhei Miyanaga, Ishikawa (JP); Sachi Minami, Ishikawa (JP); Seiji Miyazawa, Ishikawa (JP); Takashi Murata, Ishikawa (JP); Yosuke Kochi, Ishikawa (JP)

(73) Assignee: EIZO Corporation, Ishikawa (JP)

( * ) Notice: Subject to any disclaimer, the term of this patent is extended or adjusted under 35 U.S.C. 154(b) by 0 days.

(21) Appl. No.: 16/329,330

(22) PCT Filed: Aug. 9, 2017

(86) PCT No.: PCT/JP2017/028888
§ 371 (c)(1),
(2) Date: Feb. 28, 2019

(87) PCT Pub. No.: WO2018/043075
PCT Pub. Date: Mar. 8, 2018

(65) Prior Publication Data
US 2019/0254179 A1    Aug. 15, 2019

(30) Foreign Application Priority Data

Aug. 30, 2016    (JP) .................... 2016-168504

(51) Int. Cl.
*H05K 5/00* (2006.01)
*H05K 9/00* (2006.01)
(Continued)

(52) U.S. Cl.
CPC ............. *H05K 5/0017* (2013.01); *G09F 9/00* (2013.01); *H01H 36/00* (2013.01); *H04N 5/64* (2013.01);
(Continued)

(58) Field of Classification Search
CPC ...... H05K 5/0017; H05K 1/0216; H05K 5/03; H05K 9/0054; H05K 9/0022;
(Continued)

(56) References Cited

U.S. PATENT DOCUMENTS

2008/0224900 A1    9/2008    Konno et al.
2011/0267556 A1    11/2011   Nambo et al.
2012/0001942 A1    1/2012    Abe

FOREIGN PATENT DOCUMENTS

JP    S49-009965 U    1/1974
JP    S59-018329 U    2/1984
(Continued)

OTHER PUBLICATIONS

International Search Report dated Oct. 31, 2017 of corresponding International Application No. PCT/JP2017/028888; 2 pgs.
Notification of Reasons for Refusal dated Oct. 25, 2016 of corresponding Application No. JP2016-168504; 6 pgs.
Notification of Reasons for Refusal dated Jan. 24, 2017 of corresponding Application No. JP2016-168504; 7 pgs.
(Continued)

*Primary Examiner* — Rockshana D Chowdhury
(74) *Attorney, Agent, or Firm* — Maier & Maier, PLLC

(57) ABSTRACT

The present invention provides a switch capable of reducing the length in the height direction. According to the present invention, there is provided a switch comprising a switch portion having an operating surface and a circuit board having an electrode, wherein the electrode is configured to be capable of detecting an operation on the switch portion, a component mounting surface of the circuit board is arranged nonparallel to the operating surface and the thickness of the circuit board does not exceed the height of the switch portion.

7 Claims, 19 Drawing Sheets

(51) Int. Cl.
*H05K 5/03* (2006.01)
*H05K 1/02* (2006.01)
*G09F 9/00* (2006.01)
*H01H 36/00* (2006.01)
*H04N 5/64* (2006.01)
*H03K 17/96* (2006.01)

(52) U.S. Cl.
CPC ............. *H05K 1/0216* (2013.01); *H05K 5/03* (2013.01); *H05K 9/0022* (2013.01); *H05K 9/0054* (2013.01); *H03K 17/962* (2013.01); *H05K 2201/10053* (2013.01); *H05K 2201/10128* (2013.01); *H05K 2201/10151* (2013.01); *H05K 2201/10371* (2013.01)

(58) Field of Classification Search
CPC .......... H05K 2201/10128; H05K 2201/10371; H05K 2201/10053; H05K 2201/10151; H03K 17/962
See application file for complete search history.

(56) References Cited

FOREIGN PATENT DOCUMENTS

| | | | |
|---|---|---|---|
| JP | H09-171750 | A | 6/1997 |
| JP | 2000-315054 | A | 11/2000 |
| JP | 2002-215062 | A | 7/2002 |
| JP | 2007-011012 | A | 1/2007 |
| JP | 2007-170994 | A | 7/2007 |
| JP | 2007170994 | A * | 9/2007 |
| JP | 2008-226729 | A | 9/2008 |
| JP | 2008-304630 | A | 12/2008 |
| JP | 2015-170435 | A | 9/2015 |
| JP | 2015170435 | A * | 9/2015 |
| RU | 2011134053 | A | 2/2013 |

OTHER PUBLICATIONS

Decision of Refusal dated May 16, 2017 of corresponding Application No. JP2016-168504; 7 pgs.
Office Action dated Dec. 20, 2019, in corresponding Russian Application No. 2019108164/12(015735); 11 pages.

* cited by examiner

Rear perspective view

Front perspective view

SWITCH AND DISPLAY DEVICE

TECHNICAL FIELD

The present invention relates to a switch and a display device.

BACKGROUND ART

PLT1 discloses an electrostatic capacitive switch formed by providing a substrate 10 to the inner side of a bezel of a monitor 1.

CITATION LIST

Patent Literature

[PLT1] JP2008-226729

SUMMARY OF INVENTION

Technical Problem

It is required for a display device provided with a bezel around a display panel to narrow the width of the bezel so that a space can be saved without changing display contents. However, according to PLT1, the substrate interferes with the casing and it is not possible to narrow the bezel.

The present invention has been made in view of such circumstances and provides a switch capable of reducing the length in the height direction.

Solution to Problem

According to the present invention, there is provided a switch comprising a switch portion having an operating surface and a circuit board having an electrode, wherein the electrode is configured to be capable of detecting an operation on the switch portion, a component mounting surface of the circuit board is arranged nonparallel to the operating surface and the thickness of the circuit board does not exceed the height of the switch portion.

According to the present invention, the component mounting surface of the circuit board is arranged nonparallel to the operating surface and the thickness of the circuit board does not exceed the height of the switch portion. Thereby, a switch capable of reducing the length in the height direction is realized.

Various embodiments of the present invention are exemplified below. Embodiments shown below may be combined with each other.

Preferably, the electrode is provided on an end face of the circuit board.

Preferably, the switch has a conductive member in contact with the switch portion and the electrode directly or via another member.

Preferably, the conductive member is provided on a support film provided between the switch portion and the electrode.

Preferably, the conductive member is an elastic member.

Preferably, the thickness of the circuit board does not exceed the height of the conductive member.

Preferably, there is provided a display device comprising a display panel; a support frame supporting the display panel and having a bezel; and any one of the switches, wherein the bezel includes a switch portion.

Preferably, the electrode is provided on an end face of the circuit board, and the circuit board is provided in a manner such that the electrode faces the bezel.

Preferably, the display device has a shield member provided on the support frame and electrostatically shielding the circuit board.

Preferably, the distance between the electrode and the shield member is substantially constant.

Preferably, the shield member is configured not to shield the switch portion.

BRIEF DESCRIPTION OF DRAWINGS

FIGS. 1A to 1B show a display device 100 according to one embodiment of the present invention, wherein FIG. 1A is a front perspective view of the display device 100, and FIG. 1B is a rear perspective view of the display device 100.

FIG. 14A shows the circuit board 9 provided with the electrode 91 on its end face, FIG. 14B shows the conductive member 7 provided on the support film 8, and FIG. 14C shows the second shield member 12.

DESCRIPTION OF EMBODIMENTS

Various embodiments are described below. Various features shown in the embodiments below can be combined with one another. Also, embodiments are established independently for each feature.

Display Device 100

Figure 1B:
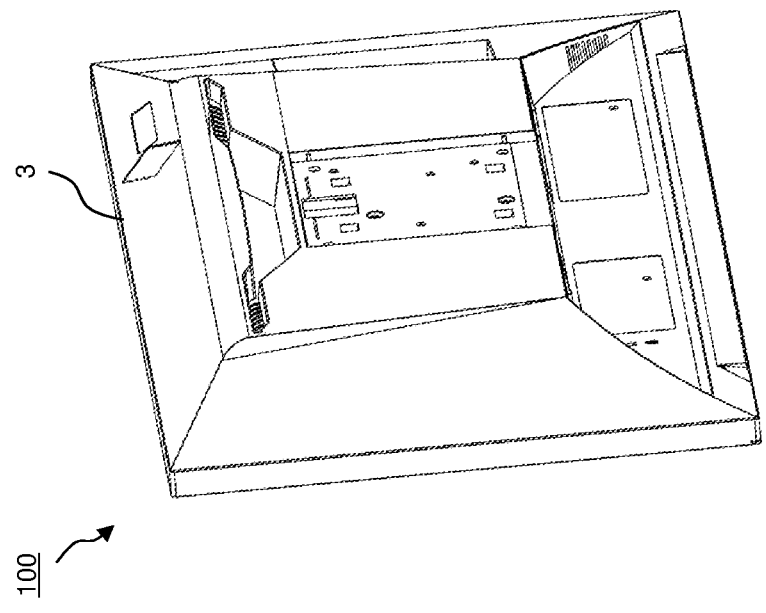
Figure 1A:
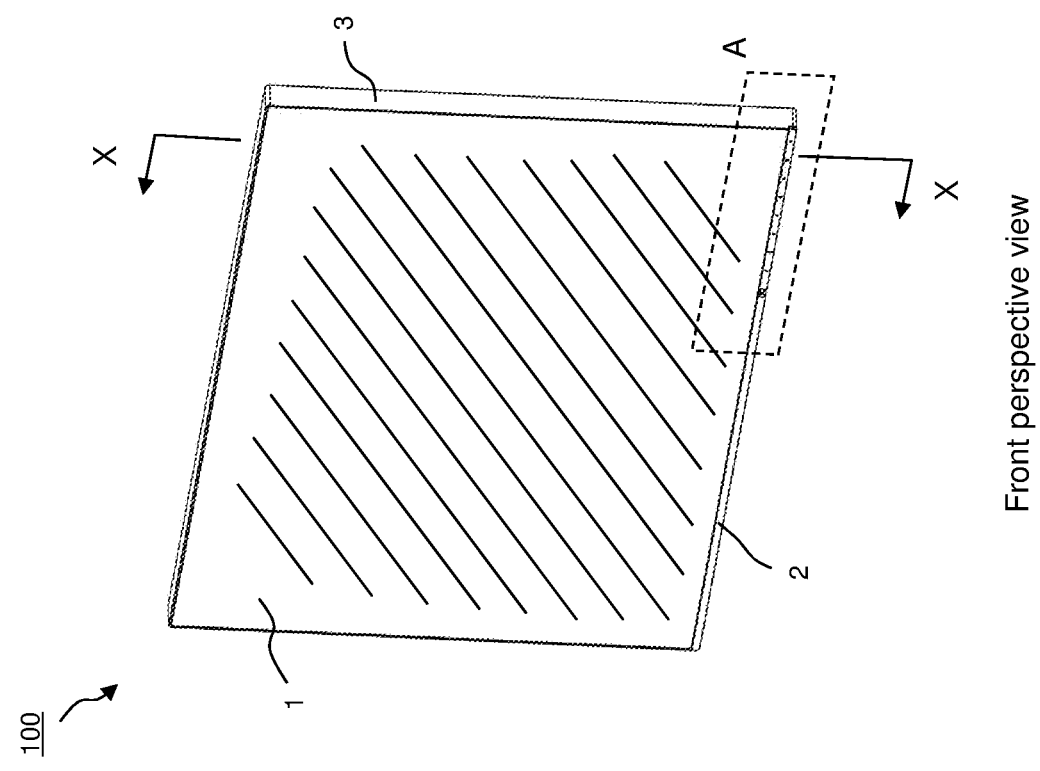
Figure 2:
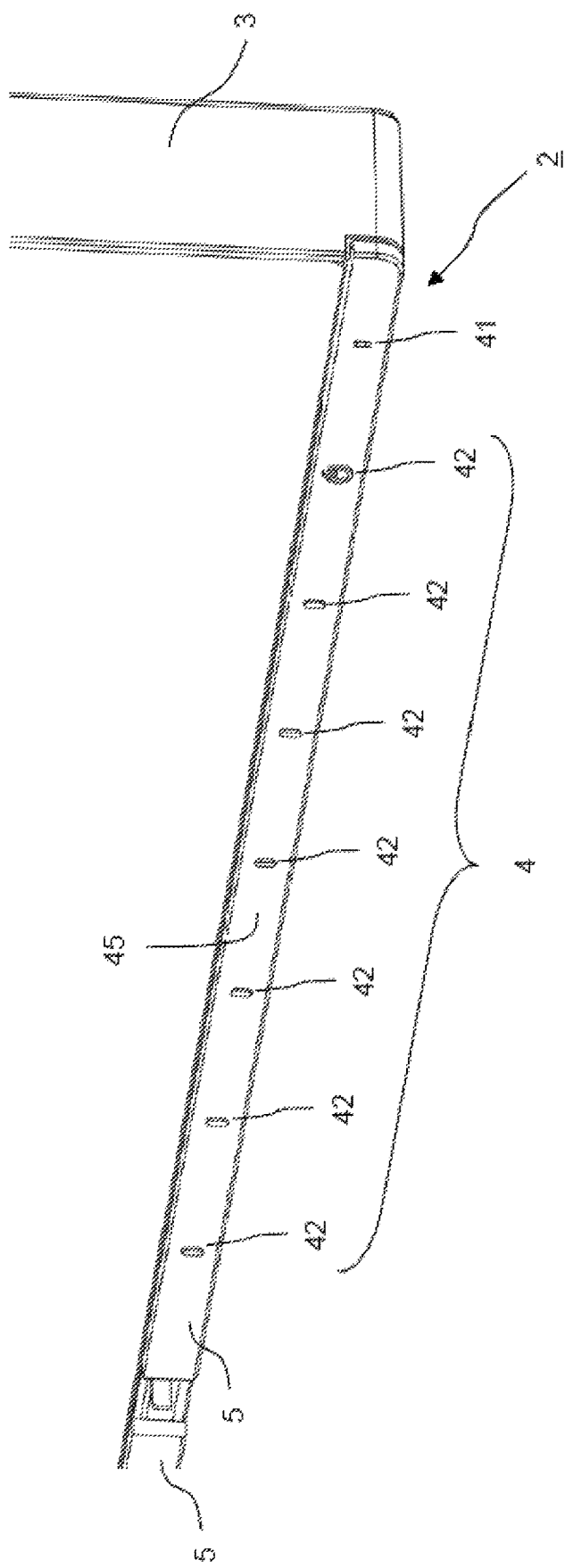
FIG. 2 is an enlarged view of a region A in FIG. 1A, showing that a bezel 5 includes a switch portion 4. A support frame 2 has a bezel 5.
Figure 3:
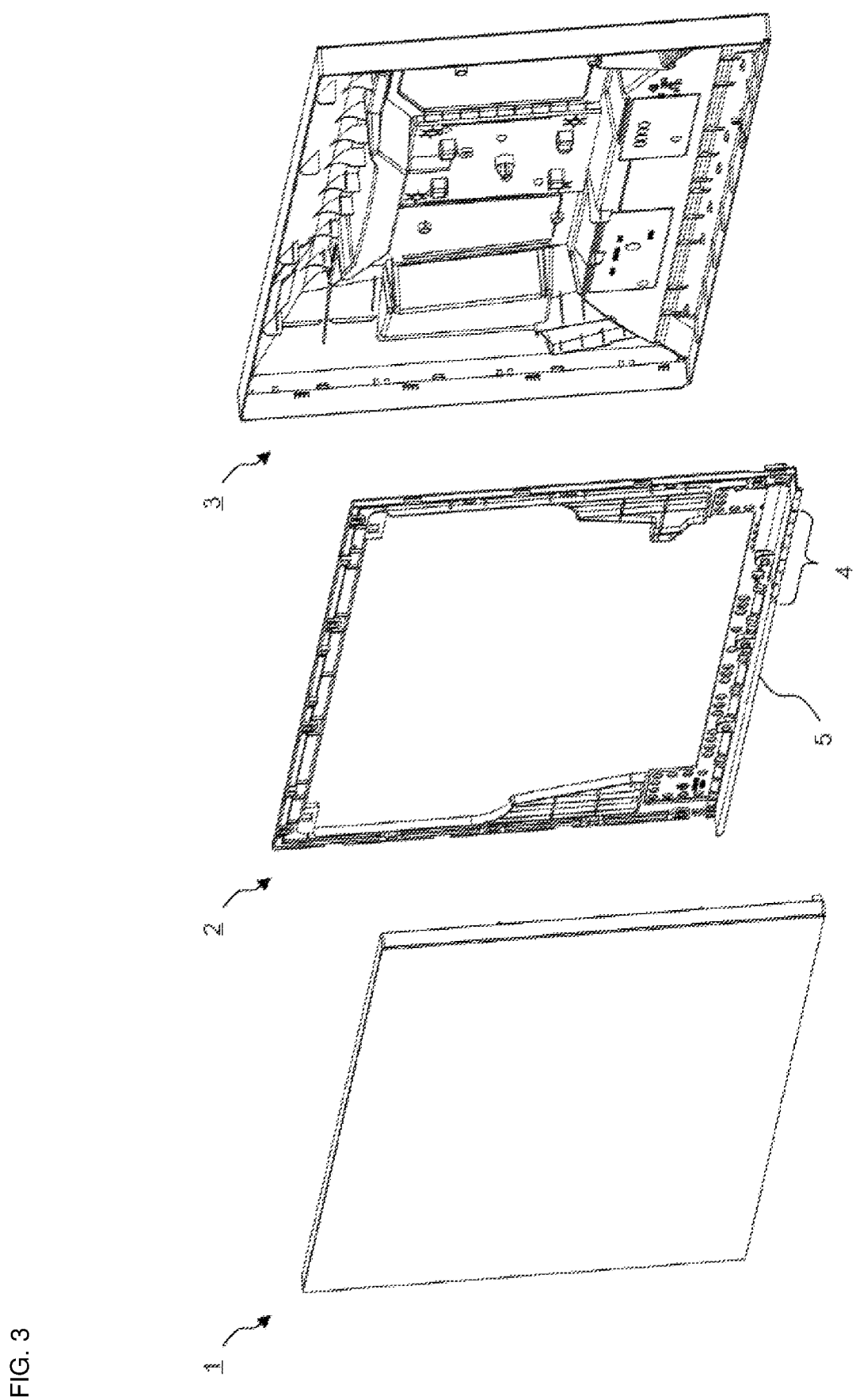
FIG. 3 is an exploded perspective view of the display device 100.

FIGS. 1 to 3 show a display device 100 according to one embodiment of the present invention. FIGS. 1A to 1B show a display device 100 according to one embodiment of the present invention, wherein FIG. 1A is a front perspective view of the display device 100, and FIG. 1B is a rear perspective view of the display device 100. FIG. 2 is an enlarged view of a region A in FIG. 1A, showing that a bezel 5 includes a switch portion 4. In the present embodiment, the bezel 5 has a support frame 2. FIG. 3 is an exploded perspective view of the display device 100.

As shown in FIG. 3, the display device 100 includes a display panel 1, the support frame 2, and a rear cover 3. The display panel 1 displays still images and moving images, for example, a liquid crystal display, a plasma display, or an organic EL display can be used.

The support frame 2 supports the display panel 1 and has the bezel 5. Specifically, the support frame 2 supports the display panel 1 from the back of the display panel 1. The bezel 5 is formed at the lower end of the support frame 2. In the present embodiment, the bezel 5 is formed over the lower end of the display panel 1 at the time of assembling the display device 100. The display panel 1 and the bezel 5 are configured to be in a flat state without a step. In the present embodiment, the support frame 2 is formed of an insulator such as engineering plastic, for example. As shown in FIG. 2, the bezel 5 is provided with a power indicator 41 and various keypads to be operated by a user. In the present embodiment, seven operation pads 42 are provided as the keypads. The operation pads 42 are used for various operations, such as adjustment of the volume, lightness, brightness, saturation, hue, display mode, etc. of the display device 100. The switch portion 4 is formed by the operation pads 42. Namely, the switch portion 4 is a part of the bezel 5. In other words, the bezel 5 includes the switch portion 4. The surface of the switch portion 4 to be operated by the user is referred to as an operating surface 45. Namely, the switch portion 4 includes the operating surface 45. Further, a capacitor is constituted by a conductive member 7 described later and a human body (mainly a finger) of the user or a device such as a touch pen or the like (hereinafter simply referred to as the user). Then, the electrode 91 (See FIG. 17) detects a change in the electrostatic capacitance of the conductive member 7 caused by the user's operation on the operating surface 45, and the functions assigned to the various operation pads 42 are controlled by a sensing chip 92 described later.

The rear cover 3 is attached from the back of the support frame 2 and encloses the side and the back of the display panel 1.

Assembly Process

Figure 4:
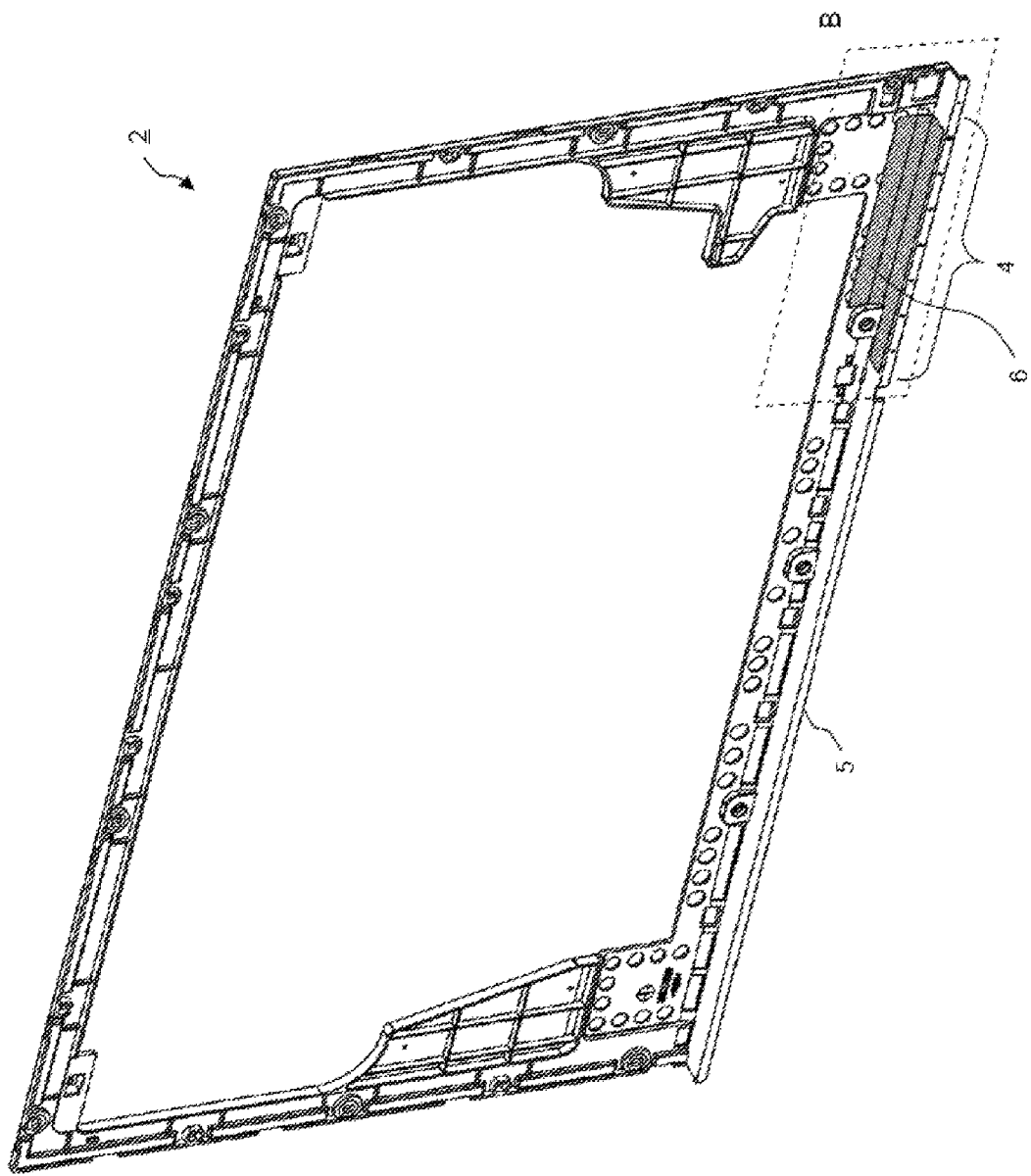
FIG. 4 is a perspective view showing a state in which a first shield member 6 is pasted to the support frame 2 before the support frame 2 is attached to the display panel 1.
Figure 5:
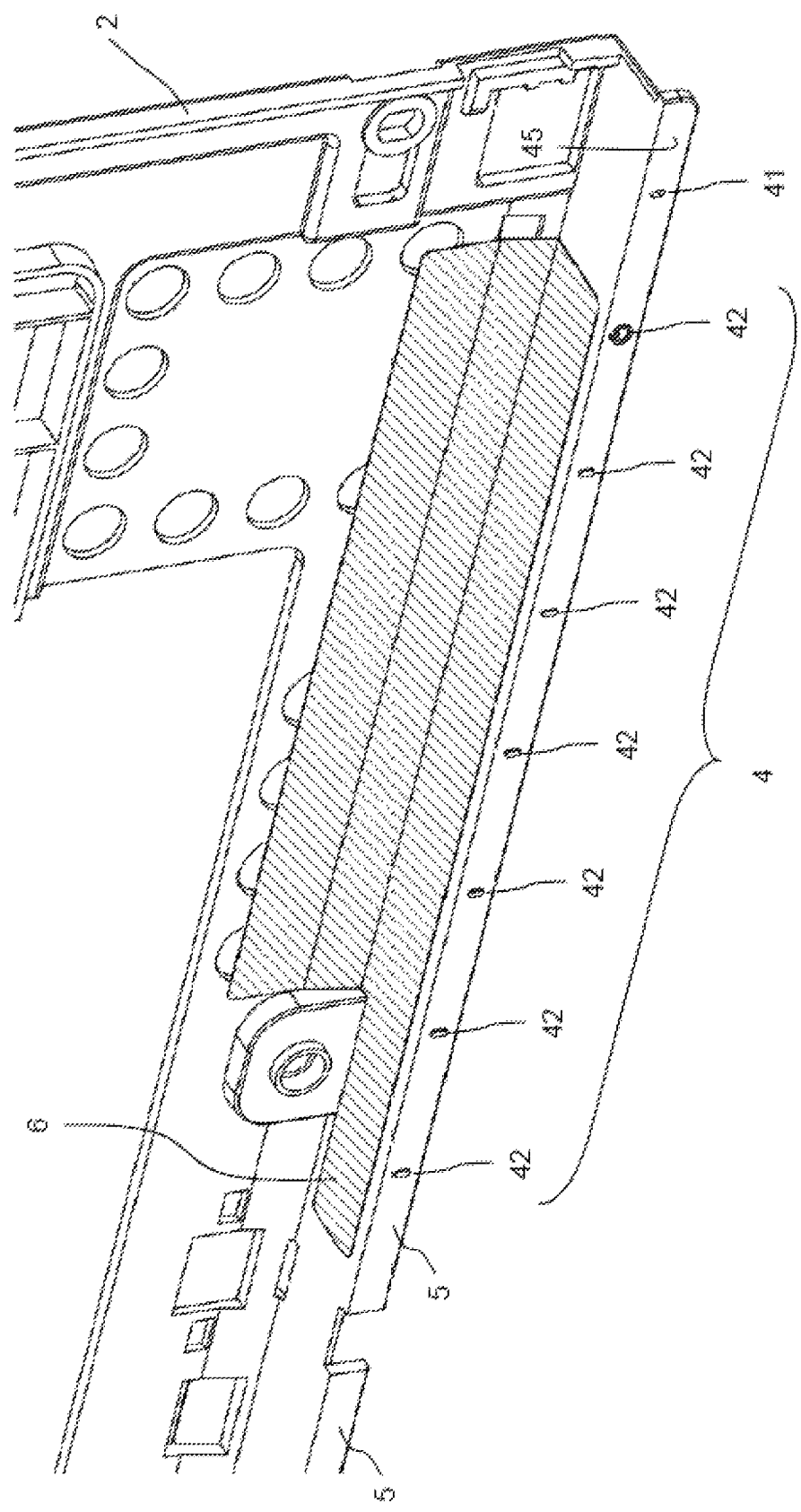
FIG. 5 is an enlarged view of a region B in FIG. 4.

Next, with reference to FIGS. 4 to 13, the assembly process of the switch 40 and the display device 100 according to the present embodiment will be described. FIG. 4 is a perspective view showing a state in which a first shield member 6 is pasted to the support frame 2 before the support frame 2 is attached to the display panel 1. FIG. 5 is an enlarged view of a region B in FIG. 4, showing a state in which the first shield member 6 is pasted in the vicinity of the switch portion 4. The first shield member 6 is, for example, a woven fabric obtained by plating a metal on the surface of an organic fiber and blocks electromagnetic waves from the inside of the display device 100, particularly the display panel 1 and from the outside of the display device 100. Namely, the first shield member 6 is provided on the support frame 2 and electrostatically shields a circuit board 9 (see FIGS. 10 and 17). Further, the first shield member 6 keeps the internal electrostatic capacitance constant, and the lower part of the first shield member 6 has a function of protecting against electrostatic discharge.

Figure 6:
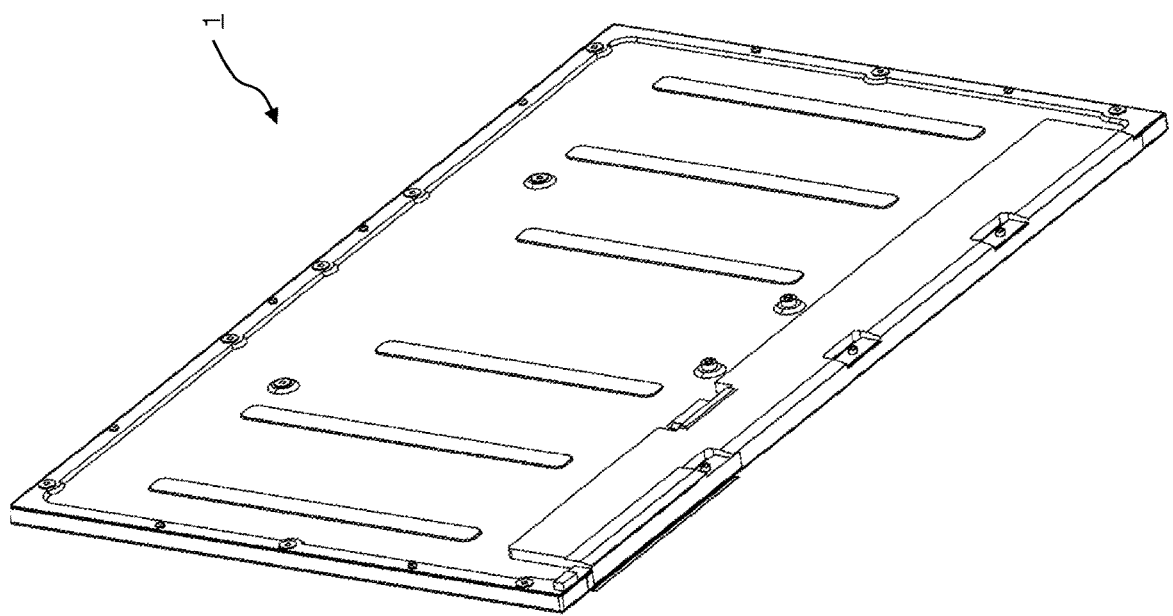
FIG. 6 is a rear perspective view of the display panel 1, as viewed from the lower side of the back of the right side viewed from the front of the display panel 1.
Figure 7:
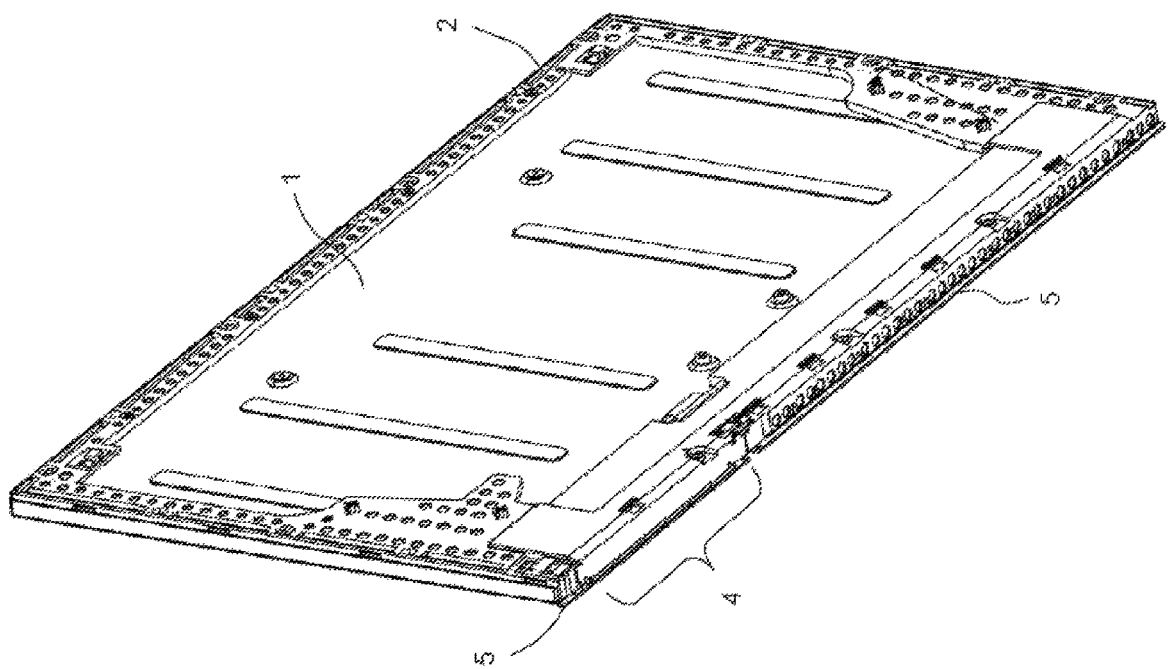
FIG. 7 shows a state in which the support frame 2 is attached to the back of the display panel 1 in FIG. 6. Thereby, the bezel 5 is provided on the lower side of the display panel 1.

FIG. 6 is a rear perspective view of the display panel 1, as viewed from the lower side of the back of the right side viewed from the front of the display panel 1. As shown in FIG. 7, the support frame 2 is attached to the back of the display panel 1. In the present embodiment, in the front view of a state in which the support frame 2 is attached to the display panel 1, the support frame 2 is configured such that the upper end side and the left and right end sides of the support frame 2 are hardly visually recognized and only the bezel 5 formed on the lower end side of the support frame 2 is visually recognized.

Figure 8:
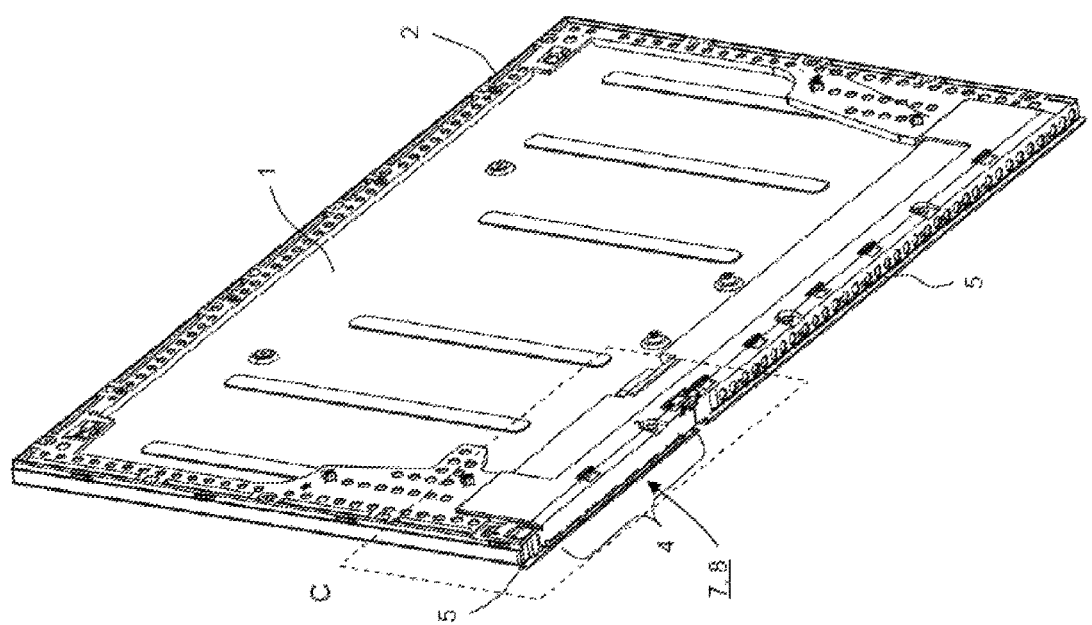
FIG. 8 shows a state in which a conductive member 7 provided on a support film 8 is attached to the back side of the bezel 5 of the support frame 2 in FIG. 7.
Figure 9:
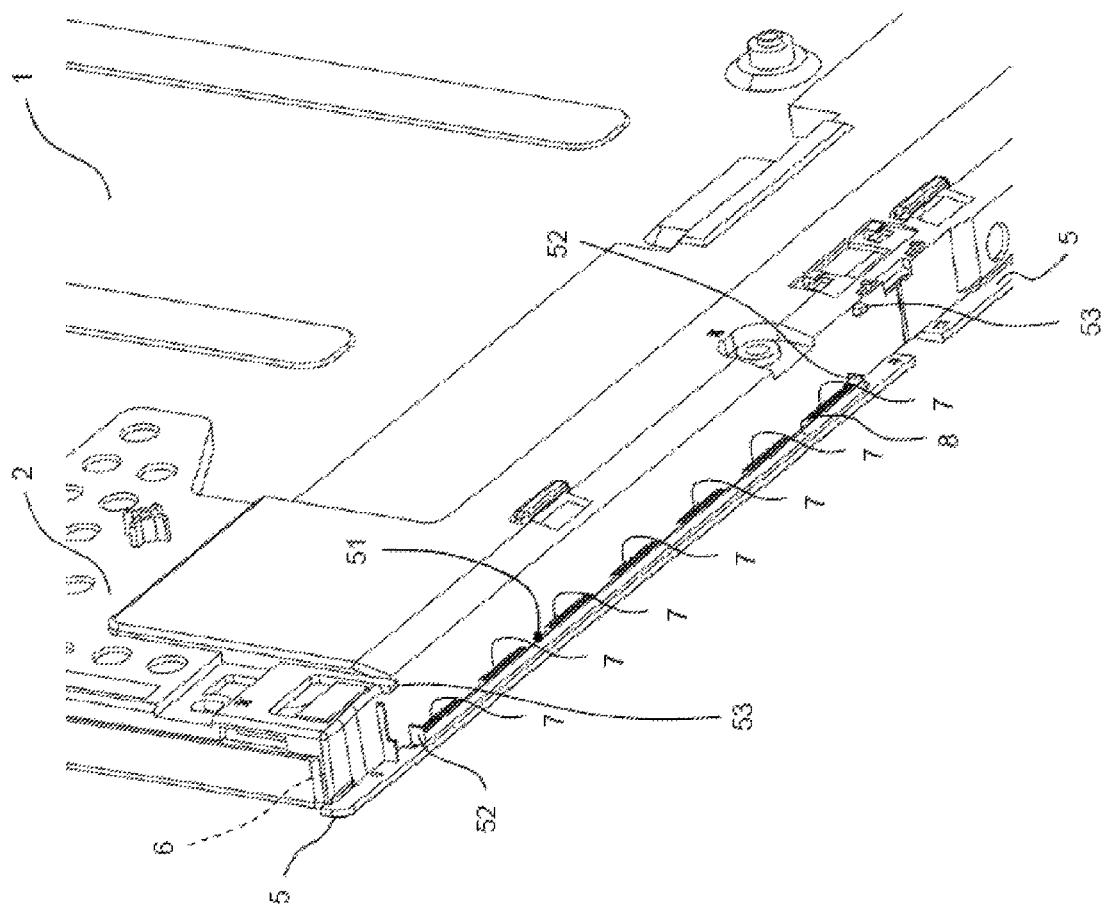
FIG. 9 is an enlarged view of a region C in FIG. 8, showing a state in which the conductive member 7 provided on the support film 8 is attached to an accommodation space 51 partitioned by two end walls 52.
Figure 14:
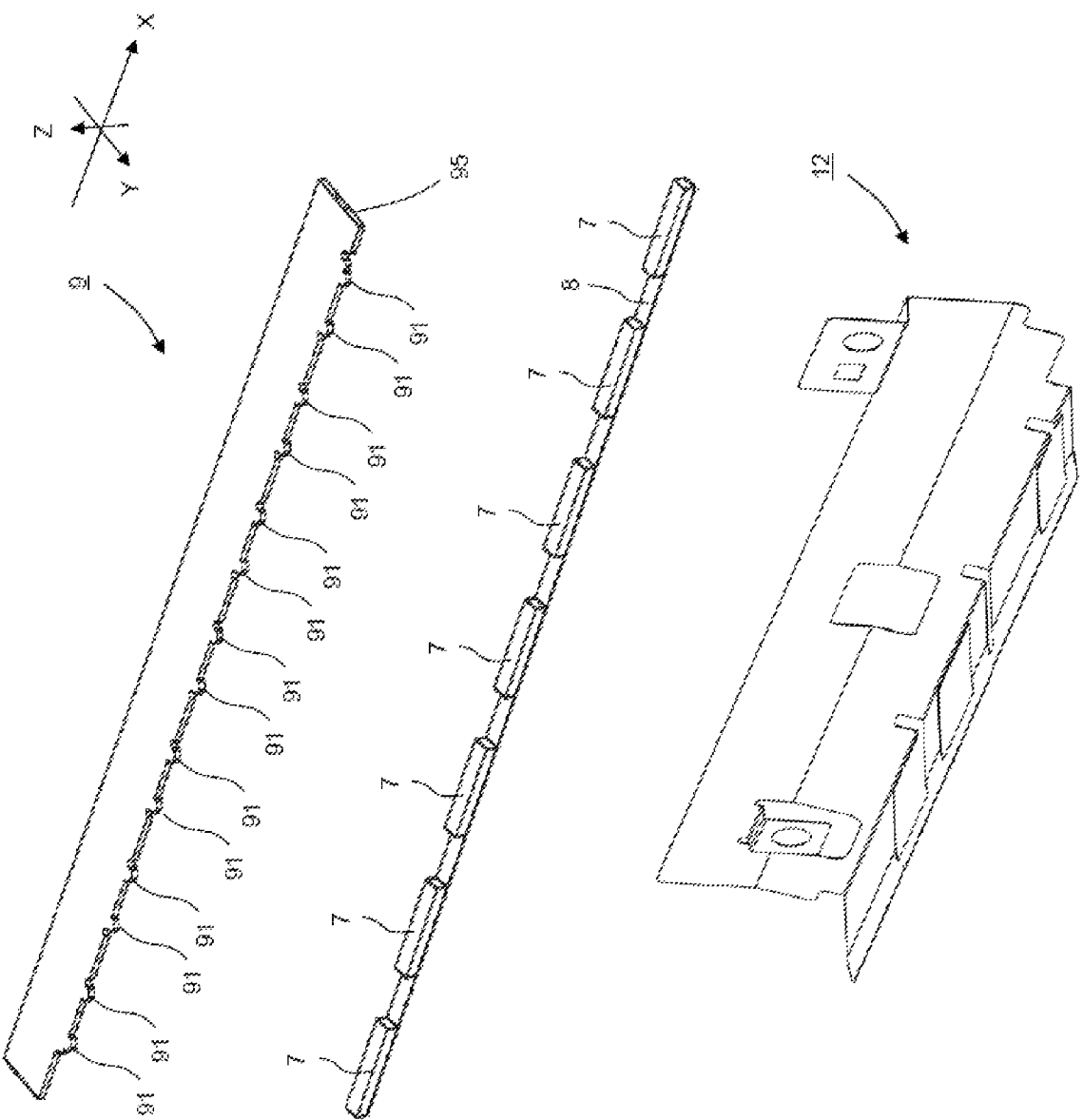
FIG. 14 is a view showing various components.

Next, as shown in FIGS. 8 and 9, a conductive member 7 provided on a support film 8 is accommodated in an accommodation space 51 provided in the support frame 2. The accommodation space 51 is located at the inner side of the switch portion 4 and is a space partitioned by two end walls 52. In the present embodiment, as shown in FIG. 14B, seven conductive members 7 are provided on the support film 8 at substantially equal intervals. The conductive member 7 is provided on the support film 8 so as to be positioned at a position corresponding to a position of an electrode 91 in the display device 100. The conductive member 7 is preferably an elastic member. For example, a conductive rubber can be used as the conductive member 7. In the present embodiment, the support film 8 has adhesive strength on both surfaces. In the state where the conductive member 7 is pasted to the support film 8, the surface opposed to the surface of the support film 8 to which the conductive member 7 is pasted is pasted to the inner wall of the accommodation space 51. Thereby, the conductive member 7 can be easily attached to the inner side of the switch portion 4. The method of providing the conductive member 7 on the support film 8 is not limited to this, and for example, it is also possible that a convex portion is provided on the conductive member 7, a hole is formed in the support film 8, and the convex portion of the conductive member 7 is fitted in the hole of the support film 8. Alternatively, the support film 8 may be adhered to the inner wall of the accommodation space 51 with an adhesive.

Figure 10:
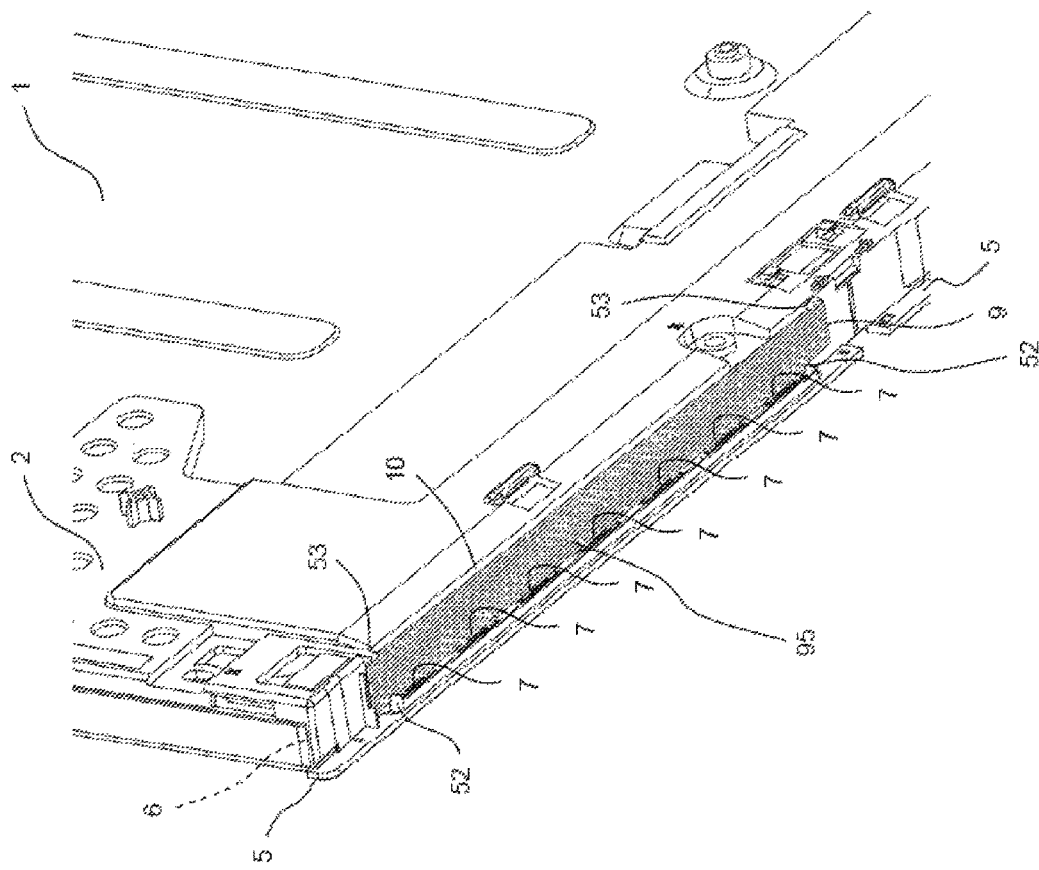
FIG. 10 shows a state in which a circuit board 9 is attached in a manner such that an electrode 91 (shown in FIG. 14A) formed on the end face of the circuit board 9 faces and comes into contact with the conductive member 7 in FIG. 9.

Next, as shown in FIG. 10, the circuit board 9 is mounted on the support frame 2 (see FIG. 14A) such that the electrode 91 (see FIG. 14A) provided on the end face of the circuit board 9 faces and comes into contact with the conductive member 7. An adhesive sheet 10 (see FIG. 15) is pasted in advance to the upper surface of the circuit board 9, and the circuit board 9 is adhered to the support frame 2 by the adhesive sheet 10. As the adhesive sheet 10, for example, a double-sided tape can be used. Further, the circuit board 9 is positioned by two positioning protrusions 53 provided on the support frame 2.

As shown in FIG. 14A, in the present embodiment, fourteen electrodes 91 are provided on the end face of the circuit board 9. The electrode 91 is formed by plating, for example. The shape of the electrode 91 is not particularly limited, as long as it has a convex shape with respect to the end face of the circuit board 9. For example, instead of the sharp convex shape as shown in FIG. 14A, the electrode 91 may have a substantially quadrangular shape, a semicircular shape, a wave shape, or the like. Further, instead of the end face of the circuit board 9, an L-shaped electrode may be provided on the lower surface of the circuit board 9, and the tip of the electrode may face the conductive member 7. In the present embodiment, the X, Y, Z directions shown in FIG. 14A correspond to the longitudinal direction, the lateral direction, and the thickness direction of the circuit board 9.

An adhesive sheet 10 (see FIG. 15) is pasted to one surface of the circuit board 9, and various electronic components (described later with reference to FIG. 18) are arranged on the component mounting surface 95 which is the other surface of the circuit board 9. In FIGS. 10 to 12, 14 and 17, illustration of electronic components is omitted. The electrode 91 provided on the circuit board 9 detects a change in the electrostatic capacitance of the conductive member 7 due to the approach of the user to the switch portion 4 (keypad) via the support film 8 and the conductive member 7. Namely, the electrode 91 is configured to be capable of detecting the operation on the switch portion 4. Specifically, the electrode 91 is configured to be capable of detecting a change in electrostatic capacitance caused by an operation on the switch portion 4. By cooperating with the sensing chip 92 and a main board 13 described later, the function assigned to the switch portion 4 (keypad) is realized. In the present embodiment, the switch 40 is configured by the switch portion 4 (keypad), the support film 8, the conductive member 7, the electrode 91 and the circuit board 9.

Figure 15:
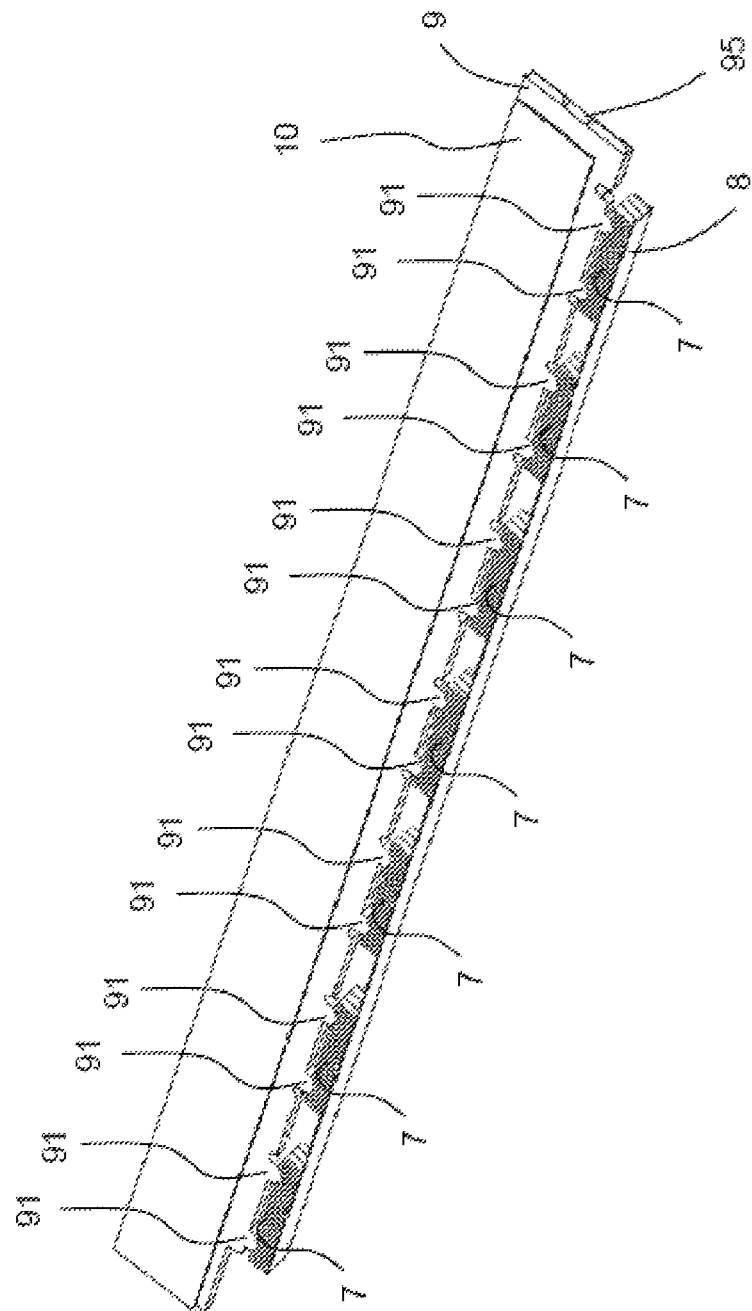
FIG. 15 shows the manner of the contact between the electrode 91 and the conductive member 7 in FIG. 10. In the present embodiment, two electrodes 91 are in contact with one conductive member 7. Further, in the present embodiment, the conductive member 7 is an elastic member, and the conductive member 7 is elastically deformed by pressing the electrode 91 facing the conductive member 7.

The manner of the contact between the electrode 91 and the conductive member 7 in FIG. 10 will be described with reference to FIG. 15. As shown in FIG. 15, in the present embodiment, two electrodes 91 are in contact with one conductive member 7. In the present embodiment, since the conductive member 7 is an elastic member, the conductive member 7 is elastically deformed by pressing the electrode 91 facing the conductive member 7. By such elastic deformation, it is possible to absorb the fluctuation of the shape or the size caused by the design tolerance. In this state, as shown in FIG. 10, the circuit board 9 can be stably attached to the support frame 2 by positioning the two points of the circuit board 9 with the positioning protrusions 53 while pasting the adhesive sheet 10 pasted to the circuit board 9 to the support frame 2. Further, in the present embodiment, the component mounting surface 95 is perpendicular to the conductive member 7.

As shown in FIGS. 10 and 15, the conductive member 7 is in contact with the switch portion 4 and the electrode 91 directly or via another member. In the present embodiment, the conductive member 7 is in direct contact with the electrode 91, and the conductive member 7 is in contact with the switch portion 4 via the support film 8. In the case where an adhering portion for adhering an adhesive to the conductive member 7 is provided and the adhering portion is adhered to the inner wall of the accommodation space 51 without using the support film 8, the conductive member 7 comes into contact with the switch portion 4 and the electrode 91.

Figure 11:
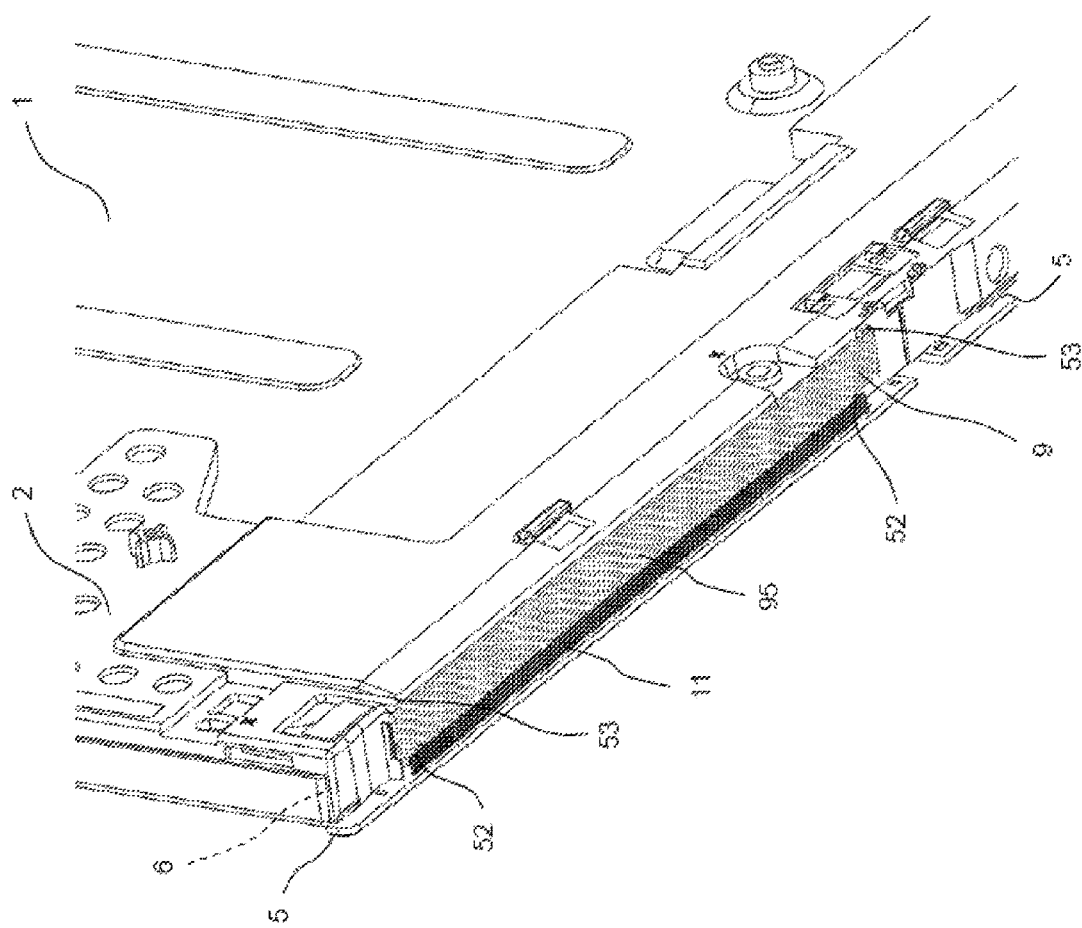
FIG. 11 shows a state in which a gap-filling member 11 for maintaining a constant distance between the electrode 91 and a second shield member 12 (shown in FIG. 14C) is attached from below the conductive member 7 in FIG. 10.

Next, as shown in FIG. 11, a gap-filling member 11 is attached from below the conductive member 7 in FIG. 10. The gap-filling member 11 maintains a constant distance between the conductive member 7 as well as the electrode 91 and a second shield member 12 (see FIG. 12) described later. The significance of keeping the distance between the conductive member 7 as well as the electrode 91 and the second shield member 12 constant will be described later with reference to FIG. 17. Here, the gap-filling member 11 is preferably made of a material having elasticity or cushioning properties.

Figure 12:
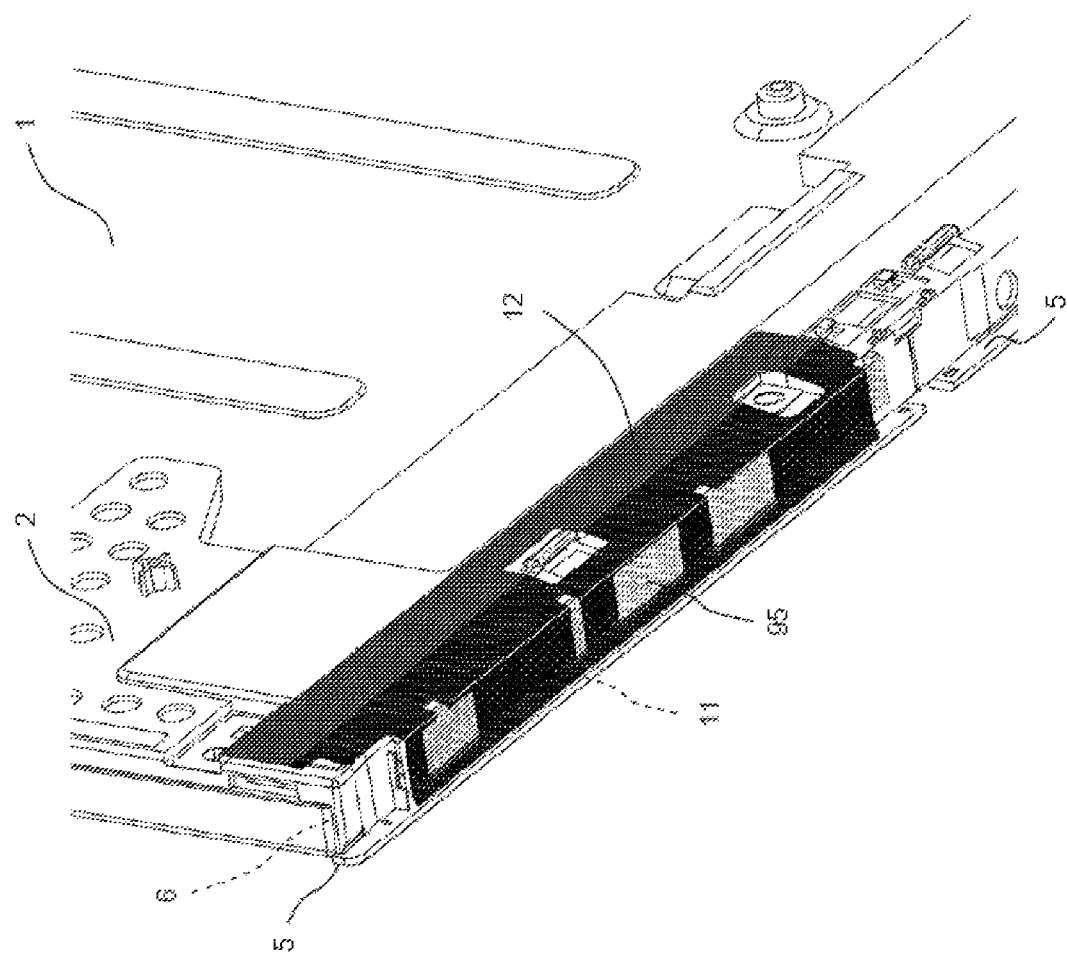
FIG. 12 shows a state in which the substantially L-shaped second shield member 12 is attached along the back of the support frame 2 from below the gap-filling member 11 in FIG. 11.

Next, as shown in FIG. 12, the substantially L-shaped second shield member 12 is attached from below the gap-filling member 11 along the back of the support frame 2. As shown in FIG. 14C, the second shield member 12 is formed, for example, by bending a metal and shields the circuit board 9 from surrounding electromagnetic waves. Like the lower part of the first shield member 6, the second shield member 12 has a function of protecting against electrostatic discharge. Thereby, it is possible to prevent erroneous detection of the user and the conductor approaching from behind the second shield member 12, and to accurately detect the approach of the user to the switch portion 4.

For the sake of explanation, in the present embodiment, the gap-filling member 11 is attached first and then the second shielding member 12 is attached. It is also possible to provide the gap-filling member 11 in the second shielding member 12 in advance and then attach the second shield member 12 to the support frame 2.

Figure 13:
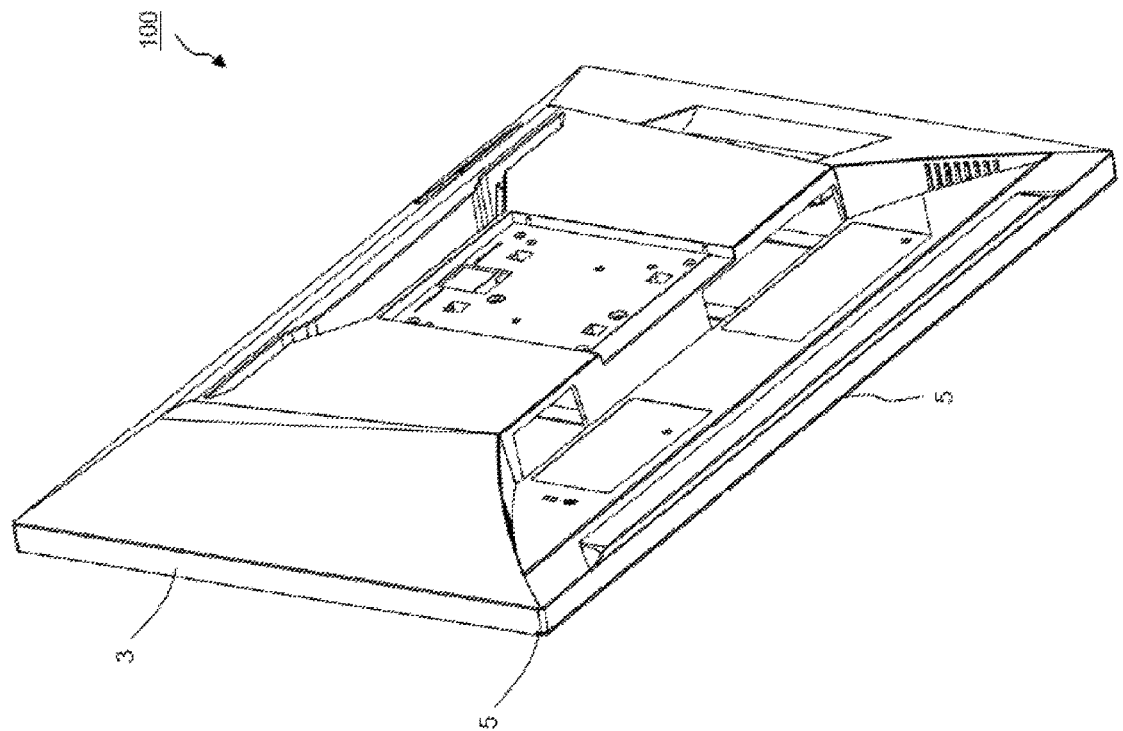
FIG. 13 shows a state in which a rear cover 3 is attached to the back of the support frame 2 in FIG. 12. This state corresponds to FIG. 1B.

Finally, as shown in FIG. 13, the rear cover 3 is attached from the back of the support frame 2. As a result, the state shown in FIG. 1B is obtained.

Cross-Sectional Views of the Display Device 100

Figure 16:
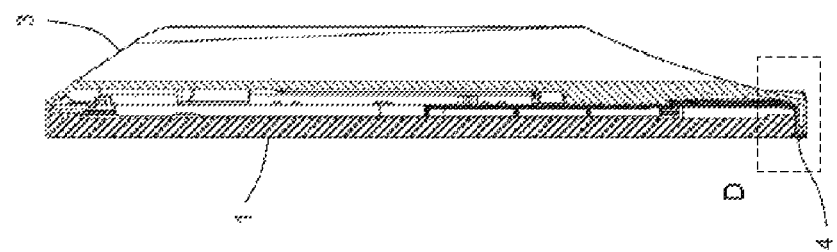
FIG. 16 is a cross-sectional view taken along line AA of FIG. 1A.
Figure 17:
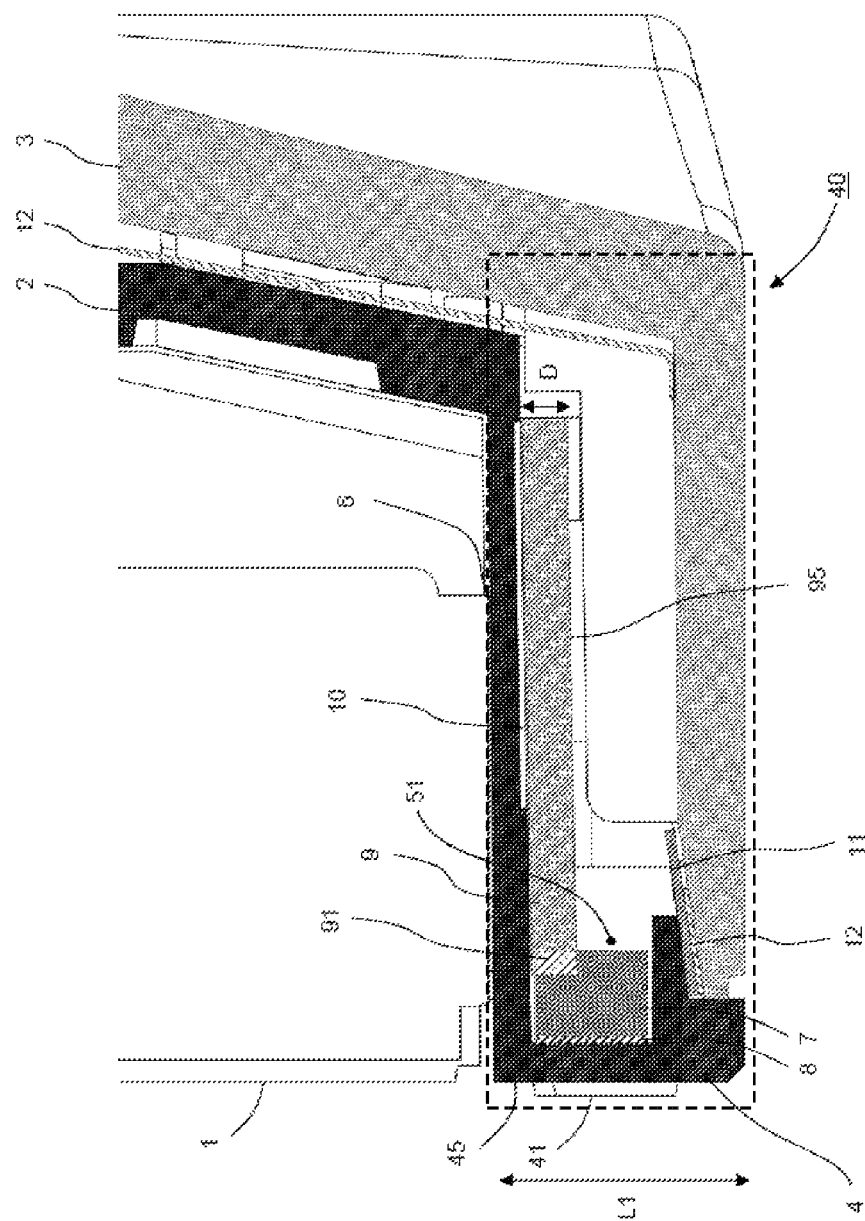
FIG. 17 is an enlarged view of a region D in FIG. 16. The switch 40 in the present embodiment is configured such that the projection height of the circuit board 9 with respect to the switch portion 4 does not exceed the height of the switch portion 4.

Next, the positional relationship between the switch portion 4 and the circuit board 9 will be described with reference to the cross-sectional views of the display device 100 shown in FIGS. 16 and 17. FIG. 16 is a cross-sectional view taken along line AA of FIG. 1A. FIG. 17 is an enlarged view of a region D in FIG. 16.

In the present embodiment, the electrode 91 is provided on the end face of the circuit board 9. The support film 8 in a state where a conductive member 7 is provided is attached to the inner side of the switch portion 4. Namely, the conductive member 7 is in contact with the switch portion 4 via the support film 8. The circuit board 9 is attached to the support frame 2 in a manner such that the electrode 91 and the conductive member 7 are in contact with each other. Thus, the switch 40 is constituted by the switch portion 4 (keypad), the support film 8, the conductive member 7, the electrode 91 and the circuit board 9. In the present embodiment, the thickness (D) of the circuit board 9 (the height of the electronic component mounted on the component mounting surface 95 is not included. The component mounting surface 95 is the upper surface or the lower surface, and is the surface opposite to the surface provided with the adhesive sheet 10 in FIG. 15 in this embodiment.) is configured not to exceed the height of the conductive member 7. As a result, desired detection sensitivity is obtained and the thickness of the switch 40 is reduced. The conductive member 7 is provided at a position corresponding to the position of the electrode 91 of the support film 8 so as to be in contact with the electrode 91 when attached to the support frame 2.

As shown in FIG. 17, the component mounting surface 95 of the circuit board 9 is arranged nonparallel to the operating surface 45. Here, "non-parallel to the operation surface 45" means that the component mounting surface 95 of the circuit board 9 does not face the operating surface 45 (=is not parallel to the operating surface 45). As an example of non-parallelism, in FIG. 17, the component mounting surface 95 of the circuit board 9 is arranged perpendicular to the operating surface 45. Further, the display device 100 is configured such that the thickness (D) of the circuit board 9 does not exceed the height (L1) of the switch portion 4. Since the height (L1) of the switch portion 4 is the same as the height (L1) of the bezel 5, the display device 100 also can be configured such that the thickness (D) of the circuit board 9 does not exceed the height (L1) of the bezel 5. In the present embodiment, the electrode 91 is provided on the end face of the circuit board 9, and the circuit board 9 is provided such that the electrode 91 faces the switch portion 4 (or the bezel 5). As shown in FIG. 17, in the present embodiment, the circuit board 9 is configured such that the component mounting surface 95 thereof is also perpendicular (nonparallel) to the display surface of the display panel 1. The circuit board 9 is not in contact with the lower end face of the display panel 1 via the support frame 2 and the first shield member 6. In other words, the circuit board 9 is provided at a position separated from the lower end face of the display panel 1. Furthermore, the circuit board 9 is provided so as to be substantially parallel to the lower end face of the display panel 1.

In addition, the second shield member 12 provided between the display panel 1 and the circuit board 9 does not shield the switch portion 4. The space between the conductive member 7 and the second shield member 12 is maintained substantially constant by the gap-filling member 11. If the distance between the conductive member 7 and the second shield member 12 changes when an external force is applied to the display device 100, the circuit board 9 may erroneously detect the capacitance change of the capacitor. The gap-filling member 11 suppresses such distance variation.

The significance of the first shield member 6 will be described. In the present embodiment, a part (the lower end face in the present embodiment) of the display panel 1 that faces at least the support frame 2 is a conductor. If the distance between the display panel 1 and the conductive member 7 changes when an external force is applied to the display device 100, the circuit board 9 may erroneously detect the capacitance change of the capacitor. Therefore, the first shield member 6 is provided on the support frame 2 to electrostatically shield the circuit board 9 and the conductive member 7. Further, by attaching the first shield member 6 to the support frame 2, even when the distance between the display panel 1 and the support frame 2 changes due to external force, the distance between the first shield member 6 and the conductive member 7 as well as the electrode 91 can be kept substantially constant, thus it is possible to more efficiently prevent such erroneous detection. The first shield member 6 does not shield the switch portion 4.

As described above, the circuit board 9 is not attached with its upper surface or lower surface facing the inner side of the switch portion 4 as in the conventional case, but is assembled in the display device 100 in state where the end face faces the inner side of the switch portion 4. Thereby, as is clear from FIG. 14A, it is possible to narrow the height of the bezel 5 as compared with a configuration in which the circuit board 9 is attached with its upper surface or lower surface facing the back side of the switch portion 4. Namely, in the configuration in which the circuit board 9 is attached with its upper surface or lower surface facing the back side of the switch portion 4, the height of the bezel 5 increases by the length in the lateral direction of the circuit board 9, whereas in the present embodiment, the height of the bezel 5 can be reduced to the thickness (D) of the circuit board 9.

As described above, the switch 40 has the switch portion 4 and the circuit board 9 including the electrode 91, and the electrode 91 is configured to be capable of detecting the operation on the switch portion 4, the component mounting surface 95 of the circuit board 9 is arranged nonparallel to the operating surface 45, and the thickness (D) of the circuit board 9 does not exceed the height (L1) of the switch portion 4.

Further, it can be said that the display device 100 is configured such that the projection height of the circuit board 9 with respect to the switch portion 4 does not exceed the height (L1) of the switch portion 4. Namely, in the example of FIG. 17, the thickness (D) of the circuit board 9 does not exceed the height (L1) of the switch portion 4.

The display device 100 includes the display panel 1, the support frame 2 supporting the display panel 1 and having the bezel 5, and the switch 40. The bezel 5 includes the switch portion 4.

Connection Between Circuit Board 9 and Main Board 13

Figure 18:
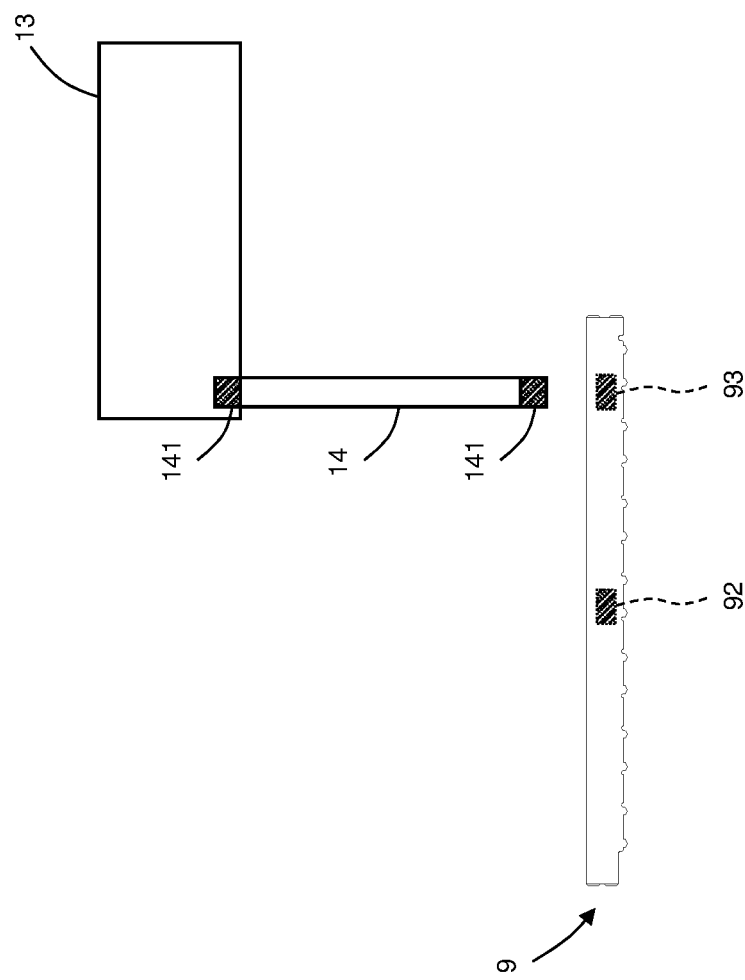
FIG. 18 is a schematic view showing a manner of the connection between the circuit board 9 and a main board 13. The main board 13 is a board attached to the inside of the rear cover 3 (see FIGS. 1 and 3), and controls the entire display device 100.

Next, the connection between the circuit board 9 and the main board 13 will be described with reference to FIG. 18. The main board 13 is a board that receives the change in the electrostatic capacitance of the capacitor detected by the switch 40 via the circuit board 9 and controls the entire display device 100. Various electronic components, memories, etc. (not shown) are connected to the main board 13 via a cable. The main board 13 is attached to, for example, the rear cover 3.

On the circuit board 9, a sensing chip 92 and a connector 93 are provided. The sensing chip 92 detects the change in the electrostatic capacitance of the capacitor detected by the switch 40 and controls the On-Off Operation by the keypad. Also, various electronic components (not shown) are provided. By the connection terminals 141 provided at both ends of a harness 14, the connector 93 provided on the circuit board 9 and the main board 13 are connected. Various functions caused by the switch 40 are controlled by the main board 13. In addition, the main board 13 can also be configured to control a photosensor (not shown), a LED, and the like.

Other Arrangement Examples of Circuit Board 9

Figure 19A:
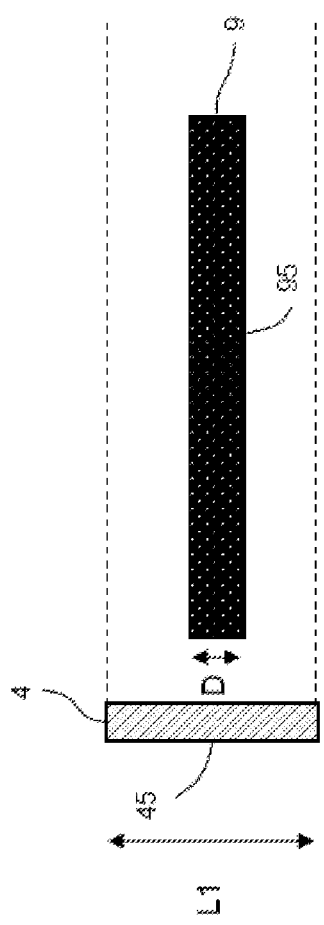
FIG. 19A shows the state of FIG. 17, and FIGS. 19B and 19C show the state where the circuit board 9 is inclined.
Figure 19B:
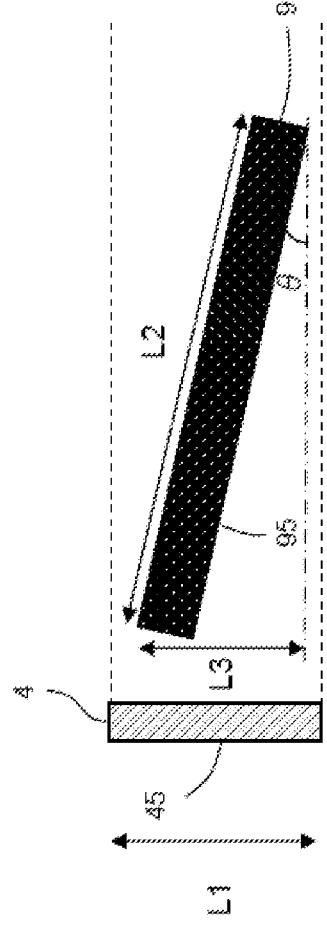
FIG. 19 is a schematic diagram showing the positional relationship between the bezel 5 and the circuit board 9.
Figure 19C:
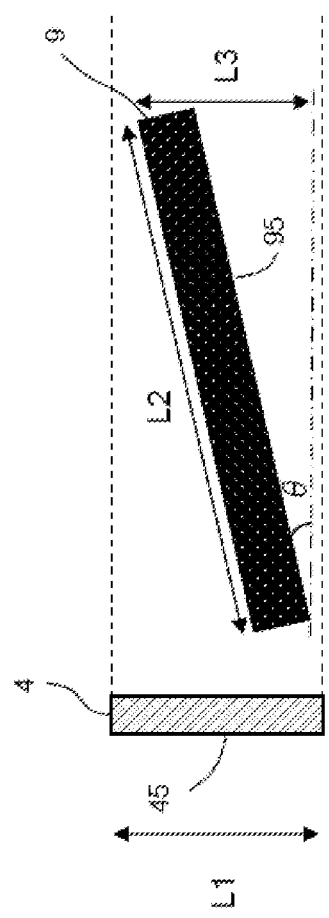

Next, other arrangement examples of the circuit board 9 will be described with reference to FIG. 19. FIG. 19 is a schematic diagram showing the positional relationship between the switch portion 4 and the circuit board 9. FIG. 19A shows the state of FIG. 17, and FIGS. 19B and 19C show the state where the circuit board 9 is inclined.

In the example of FIG. 19A, the thickness (D) of the circuit board 9 does not exceed the height (L1) of the switch portion 4 in a side view in the height (L1) direction of the switch portion 4.

As shown in FIGS. 19B and 19C, the component mounting surface 95 of the circuit board 9 is not necessarily provided perpendicular to the operating surface 45 of the switch portion 4 and the component mounting surface 95 of the circuit board 9 can also be disposed in an inclined state. In these examples, in the side view in the height (L1) direction of the switch portion 4, (1) the angle θ between the lateral direction of the circuit board 9 and the direction perpendicular to the switch portion 4, (2) the height (L1) of the switch portion 4, and (3) the length in the lateral direction (L2) of the circuit board 9 satisfy the following relationship.

$$L2 \sin \theta (=L3) < L1$$

In other words, in the examples of FIGS. 19B and 19C, the display device 100 is configured such that the projection height (L3) of the circuit board 9 with respect to the switch portion 4 does not exceed the height (L1) of the switch portion 4.

As described above, in the present embodiment, the thickness (D) of the circuit board 9 does not exceed the height (L1) of the switch portion 4 (bezel 5). Alternatively, the display device 100 is configured such that the projection height (L3) of the circuit board 9 with respect to the switch portion 4 does not exceed the height (L1) of the switch portion 4. Thus, regardless of the length (L2) of the circuit board 9 in the lateral direction, the height (L1) of the switch portion 4 (bezel 5) can be reduced to the extent of the thickness (D) of the circuit board 9 or the projection height (L3) of the circuit board 9 with respect to the switch portion 4 (bezel 5).

Although the embodiments of the present invention have been described above, the present invention is not limited to these embodiments. It can be applied not only to the above-described electrostatic capacitive switch but also to other types of switches such as a pressure sensitive switch. Further, the conductive member 7 can be attached to the inner wall of the accommodation space 51 with a conductive adhesive or the like, without using the support film 8. Alternatively, the electrode 91 may be in direct contact with the switch portion 4 without using the conductive member 7. Further, a pressing member can be attached to the end face of the circuit board 9 opposite to the end face on which the electrode 91 is provided, and by pressing the circuit board 9, the contact between the electrode 91 and the switch portion 4 will be improved.

Further, the bezel 5 including the switch portion 4 can also be provided on the upper, left or right edge of the display panel 1. The circuit board 9 can also be disposed at a predetermined angle with respect to the direction of the bezel 5.

DESCRIPTION OF REFERENCE SIGNS

100: display device
1: display panel
2: support frame
3: rear cover
4: switch portion
40: switch
41: power indicator
42: operation pad
45: operating surface
5: bezel
51: accommodation space
52: end wall
53: positioning protrusion
6: first shield member
7: conductive member
8: support film
9: circuit board
91: electrode
10: adhesive sheet
11: gap-filling member
12: second shield member
13: main board
14: harness
141: connection terminal
92: sensing chip
93: connector
95: component mounting surface

The invention claimed is:

1. A display device comprising: a display panel;
a support frame supporting the display panel and having a bezel;
a switch portion having an operating surface; and a circuit board having an electrode,
wherein the bezel includes the switch portion, and is provided on the front surface of the display device,
the electrode is provided on an end face of the circuit board and is configured to be capable of detecting an operation on the switch portion,
the circuit board is provided in a manner such that the electrode faces the switch portion, a component mounting surface of the circuit board is arranged nonparallel to the operating surface, and the thickness of the circuit board does not exceed the height of the switch portion and
a conductive member that is in contact with the switch portion and the electrode directly.

2. The display device of claim 1, wherein the conductive member is provided on a support film provided between the switch portion and the electrode.

3. The display device of claim 1, wherein the conductive member is an elastic member.

4. The display device of claim 1, wherein the thickness of the circuit board does not exceed the height of the conductive member.

5. The display device of claim 1, comprising:
a shield member provided on the support frame and electrostatically shielding the circuit board.

6. The display device of claim 5, wherein
the distance between the electrode and the shield member is substantially constant.

7. The display device of claim 5, wherein
the shield member is configured not to shield the switch portion.

* * * * *